United States Patent [19]
Ho et al.

[11] Patent Number: 5,825,799
[45] Date of Patent: Oct. 20, 1998

[54] MICROCAVITY SEMICONDUCTOR LASER

[75] Inventors: Seng-Tiong Ho, Wheeling, Ill.; Daniel Yen Chu, Milpitas, Calif.; Jian-Ping Zhang; Shengli Wu, both of Evanston, Ill.

[73] Assignee: Northwestern University, Evanston, Ill.

[21] Appl. No.: 450,284

[22] Filed: May 25, 1995

[51] Int. Cl.$^6$ ........................................ H01S 3/05
[52] U.S. Cl. ........................... 372/92; 372/94; 372/108; 372/66; 372/67; 385/31; 385/32
[58] Field of Search ................... 372/108, 104, 372/66, 67, 92, 94, 43, 50; 385/31, 32

[56] References Cited

U.S. PATENT DOCUMENTS

| | | | |
|---|---|---|---|
| 3,934,148 | 1/1976 | Collins | 385/32 |
| 5,216,727 | 6/1993 | Vakhshoori et al. | 385/31 |
| 5,343,490 | 8/1994 | McCall | 372/94 |
| 5,351,261 | 9/1994 | Lanzerotti et al. | 372/99 |
| 5,396,511 | 3/1995 | Nakatsuka et al. | 372/43 |
| 5,398,256 | 3/1995 | Hohimer et al. | 372/50 |
| 5,526,449 | 6/1996 | Meade et al. | 385/32 |

OTHER PUBLICATIONS

Spontaneous Emission from Excitons in Cylindrical Dielectric Waveguides and the Spontaneous–Emission Factor of Microcavity Ring Lasers; J. Opt. Soc. Am. B/vol. 10, No. 2/Feb. 1993.
Directional Light Coupling from Microdisk Lasers; Appl. Phys. Lett. 62 (6), Feb. 8, 1993, pp. 561–563.
Double–Disk Structure for Output Coupling in Microdisk Lasers; Appl. Phys. Lett. 65(25), Dec. 19, 1994, pp. 3167–3169; D. Y. Chu, et al.
1.5–um InGaAs/InAlGaAs Quantum–Well Microdisk Lasers; IEEE Photonics Technology Letters, vol. 5, No. 12, Dec., 1993, pp. 1353–1355, D. Y. Chu, et al.
Estimation of the Spontaneous Emission Factor for Microdisk Lasers Via the Approximation of Whispering Gallery Modes; J. Appl. Phys. 75(7), Apr. 1, 1994, pp. 3302–3307, Chin, et al.
Spontaneous Emission from Excitons in Cylindrical Dielectric Waveguides and the Spontaneous–Emission Factor of Microcavity Ring Lasers; J. Opt. Soc. Am B/vol. 10, No. 2, Feb. 2, 1993, pp. 381–390.
Spontaneous Emission from Excitons in Thin Dielectric Layers; Optics Letters, vol. 18, No. 11, Jun. 1, 1993, pp. 909–911, S. L. McCall, et al.
QELS 1991, Tuesday Morning Agenda (May 14) 2 pages.
Room–Temperature Lasing Action in $In_{0.51}Ga_{0.49}P/In_{0.2}Ga_{0.8}As$ Microcylinder Laser Diodes; Appl. Phys. Lett. 62 (17), Apr. 26, 1993, pp. 2021–2023, A. F. J. Leva, et al.
Whispering–Gallery Mode Microdisk Lasers, Appl. Phys. Lett. 60 (3), Jan. 20, 1992, pp. 289–291, S.L. McCall, et al.

*Primary Examiner*—Rodney B. Bovernick
*Assistant Examiner*—Yisun Song
*Attorney, Agent, or Firm*—McAndrews, Held & Malloy, Ltd.

[57] ABSTRACT

Laser comprising a first lasing microdisk, microcylinder or microannulus defining a microcavity having a circular cross-sectional periphery and a second waveguiding micromember spaced from the first lasing micromember in a different plane and optically coupled by resonant photon tunneling. The second waveguiding micromember includes a light output coupling for providing light output from the laser without adversely affecting the Q value and low lasing threshold of the microcavity.

31 Claims, 8 Drawing Sheets

MICROCAVITY SEMICONDUCTOR LASER

This invention was made with Government support under Grant No.: ECS-9210434 awarded by the National Science Foundation and Grant No.: F30602-94-1-0003 awarded by the Advanced Research Project Agency of the Department of Defense. The Government may have certain rights in the invention.

FIELD OF THE INVENTION

The present invention relates to microcavity semiconductor lasers and, more particularly, to microdisk, microcylinder, microannulus and like semiconductor lasers.

BACKGROUND OF THE INVENTION

Microcavity semiconductor lasers recently have been described for operation at liquid nitrogen temperature and room temperature. Such microcavity semiconductor lasers employ an active lasing medium that supports optical modes in the form of a whispering gallery mode where photons skimming around the circumference of a microdisk or microcylinder having an appropriately small diameter are continually totally reflected. The thin microdisk or microcylinder is positioned in a surrounding medium (e.g. air) having a high contrast of refractive index relative to that of the active lasing medium such that the optical mode is strongly confined inside the microdisk or microcylinder in the vertical direction and coupled to the active lasing medium comprising one or more quantum wells. For example, a whispering-gallery-mode microdisk semiconductor laser is described by McCall et al. in "Whispering-gallery mode microdisk lasers" in Appl. Phys. Lett. 60, (3), 20 Jan. 1992. A whispering-gallery-mode microcylinder semiconductor laser is described by Levi et al. in "Room-temperature lasing action in $In_{0.51}Ga_{0.49}P/In_{O.2}Ga_{0.8}As$ microcylinder laser diodes" in Appl. Phys. Lett. 62, (17), 26Apr. 1993.

Microcavity semiconductor lasers are advantageous as compared to conventional semiconductor lasers in being much smaller in size and requiring substantially less minimum operating current (power) in the range of microwatts. However, there is no directional coupling of light out from such microcavity lasers. In fact, the photons are strongly confined inside the microdisk or microcylinder. This is disadvantageous in that a directional coupling of light out of the laser is necessary for useful applications.

Recently, in "Directional light coupling from microdisk lasers", Appl. Phys. Lett. 62, 561 (1993) an asymmetric point was introduced into a single circular microdisk to provide a location of increased quantity of lasing light to leak out from the point of asymmetry. Moreover, there has been a suggestion to provide grating fabricated directly on the microdisk to couple light therefrom. However, as a result of the small size of the microdisk, fabrication of grating or other light output coupling structure thereon is difficult to achieve without at the same time adversely affecting the Q value (quality factor) of the microcavity and the low lasing threshold.

An object of the present invention is to provide microcavity seminconductor lasers having features amenable for coupling light out from the laser without substantially adversely affecting the Q value and the low lasing threshold of the microcavity.

Another object of the present invention is to provide microcavity seminconductor lasers having features amenable for coupling light out from the laser to integrated optical circuits.

SUMMARY OF THE INVENTION

The present provides a microcavity semiconductor laser comprising a first micromember, such as a microdisk, microcylinder or microannulus, having a lasing microcavity (one or more quantum wells) with a circular cross-sectional perpiphery and a second waveguiding micromember, which may comprise a microdisk, microcylinder or microannulus, spaced from the first lasing micromember in a different plane, such as at a different epitaxial level during fabrication of the laser by layer growth processes. The first lasing micromember and the second waveguiding micromember are optically coupled by, for example, resonant photon coupling by being spaced apart a selected distance from one another with a material having a lower refractive index disposed between the micromembers. The first lasing micromember and second waveguiding micromember are spaced apart by a distance selected to provide a given coupling efficiency therebetween. The high Q value and low lasing threshold of the lasing microcavity is maintained by providing a light output coupling on the second waveguiding micromember, rather than on the first lasing micromember.

The light output coupling on the second waveguiding micromember may comprise in one embodiment of the invention a surface, such as one or more flat surfaces or windows, interrupting an outer circumference of the waveguiding micromember. Alternately, the light output coupling may comprise in another embodiment of the invention grating or other surface on an axial end surface of the waveguiding micromember and having a vertical component of light emission. Still further, the light output coupling may comprise in another embodiment of the invention a linear output waveguide integral to the second waveguiding micromember, or an arcuate waveguide encircling a portion of the circumferential perphiery of the micromember pursuant to an additional embodiment of the invention.

In a particular embodiment of the invention, the first micromember comprises one or more InGaAs semiconductor microdisks, microcylinders, or microannulus as quantum wells separated by appropriate barrier layers and the second waveguiding micromember comprises a InGaAsP semiconductor microdisk, microcylinder, or microannulus. The optical coupling can comprise a low refractive index InP pedestal, microcylinder or microannulus.

The present invention also provides a laser comprising a waveguiding or lasing micromember having a circular cross-sectional periphery and an arcuate light output waveguide encircling a portion of the circumference of the waveguiding micromember to provide light output therefrom. The arcuate light output waveguide can comprise a circular portion encirling the micromember and at least one linear portion terminating in an end. The light output waveguide is at a level on a substrate compatible with an integrated optical circuit present on the substrate so as to provide light output signals to the optical circuit.

The lasers of the present invention provide the advantages associated with microcavity semiconductor lasers while providing light output coupling from the laser that is usable in a service application and that is compatible with integrated optical circuits.

The above objects and advantages of the present invention will become more readily apparent from the following detailed description taken with the following drawings.

DETAILED DESCRIPTION OF THE INVENTION

Figure 1:
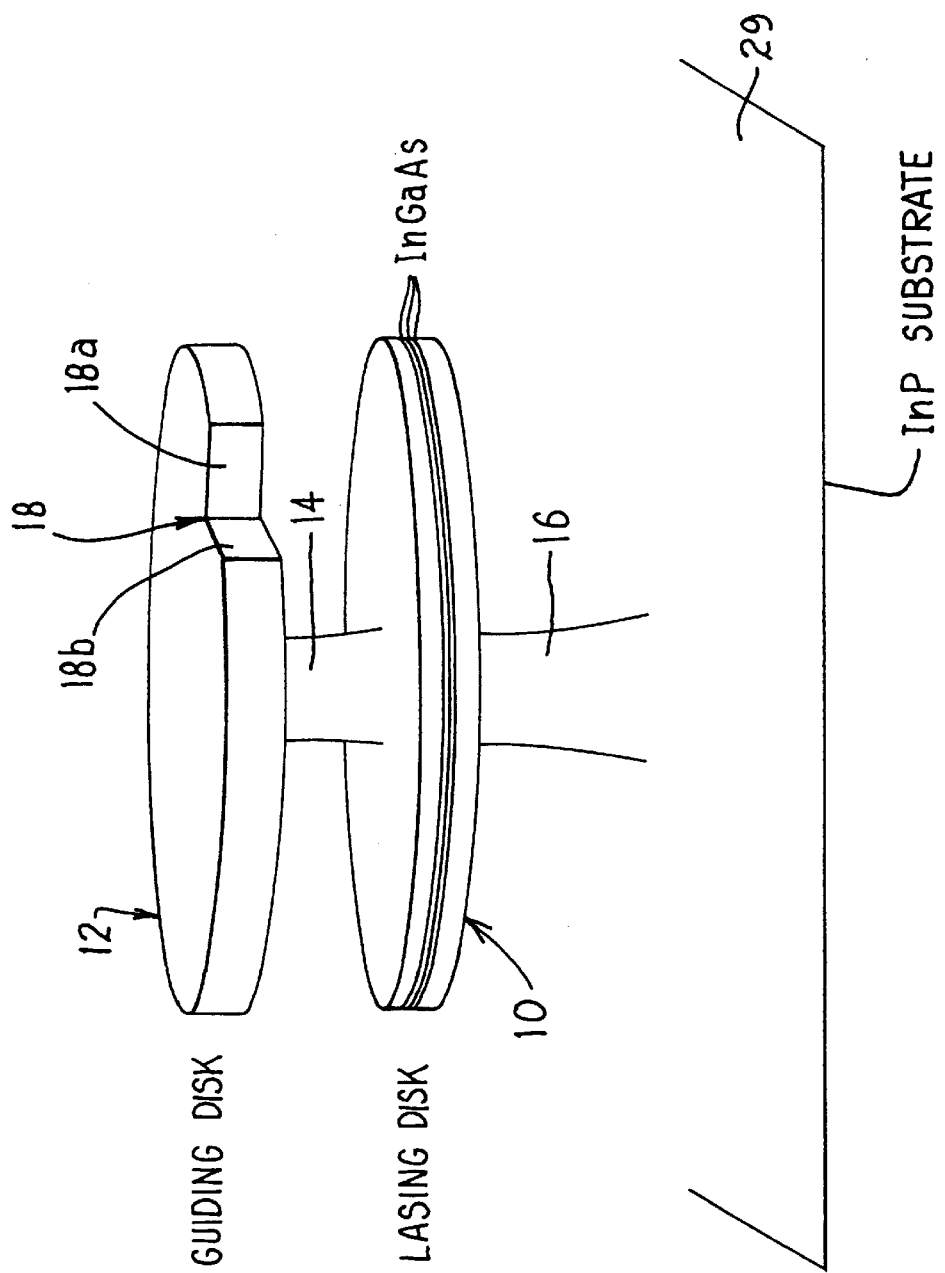
FIG. 1 is a schematic view of a microcavity (microdisk) laser in accordance with one embodiment of the invention.

Referring to FIG. 1, a microcavity semiconductor laser in accordance with one embodiment of the invention is illustrated schematically as including a first lower microdisk (micromember) 10 referred to as lasing disk in FIG. 1 and a second upper, transparent waveguiding microdisk (micromember) 12 referred to as guiding disk in FIG. 1 disposed in a different plane (different epitaxial level during epitaxial layer growth) from the lower microdisk 10 so as to have low light absorption. The first lower lasing microdisk 10 and second upper waveguiding microdisk 12 are shown having the same diameters. However, the invention is not so limited and can be practiced with the microdisks 10, 12 having different diameters and different shapes at some expense of lowering the optical coupling efficiency between the microdisks. The first lower lasing microdisk 10 can be excited by suitable means such as optically (e.g. by a pumping laser providing pulsed light of appropriate duty cycle) or electrically (e.g. by electrical current pulses of appropriate duty cycle via lead wires attached to a top and bottom of the micromember) as is known.

The lower lasing microdisk 10 and the upper waveguiding microdisk 12 are optically coupled by resonant photon tunneling by being spaced apart a selected distance from one another with a material having a lower refractive index disposed between the micromembers. In FIG. 1, the microdisks 10, 12 are spaced apart by a pedestal 14 comprising InP, although the invention is not so limited as the microdisks also could be suspended or otherwise spaced to provide a low refractive index material, such as air, $SiO_2$, acrylic, or semiconductor (e.g. InP), therebetween to provide resonant photon tunneling therebetween. The lower lasing microdisk 10 is connected to a lower substrate by an integral upstanding pedestal 16. The upper waveguiding disc 12 includes a circumferential V-shape or wedge-shaped opening or notch 18 as a light output coupling from the laser.

The double microdisk laser shown in FIG. 1 was formed by molecular beam epitaxial growth of layers of the InGaAs/InGaAsP and then shaping the layers to the double disk configuration shown by multistep photolithographic techniques and selective reactive ion etching techniques. In particular, an initial $In_{0.84}Ga_{0.16}As_{0.33}P_{0.67}$ etch stop layer was grown on the top of the semi-insulating (100) InP substrate shown in FIG. 1. Then, a 1.0 micron thick InP pedestal layer was grown on the etch stop layer. A 0.2 micron thick microcavity quantum well (MQW) layer was grown on the pedestal layer. The MQW layer was grown to comprise three (3) $In_{0.53}Ga_{0.47}As$ quantum layers or wells each of approximate 100 Angstroms thickness sandwiched by $In_{0.84}Ga_{0.16}As_{0.33}P_{0.67}$ barrier layers of approximate 100 Angstroms thickness with end caps having the barrier composition of approximate 700 Angstroms thickness. A second InP pedestal layer having a 0.65 micron thickness was grown on the MQW layer followed by a final passive layer of $In_{0.84}Ga_{0.16}As_{0.33}P_{0.67}$ to a thickness of approximately 0.2 micron as the top guiding microdisk layer. Other suitable material systems (e.g. InGaAs/InAlGaAs) can be used to fabricate the laser.

Multi-step photolithographic techniques were used to fabricate the the double-disk lasers having outer diameters of 3 microns in one trial and 10 microns in another trial. The opening 18 was patterned first using an AZ-1350J photoresist and etched down around 0.4 micron using reactive ion etching without etching the MQW layer. After removing the photoresist, the circular cross-section microdisks 10, 12 were patterned and carefully aligned with the opening. Then, reactive ion etching was used again to etch the circular patterns down vertically (approximately 1.2 microns) into the bottom pedestal layer to form the microdisks 10, 12 having a right cylindrical shape (i.e. a circumferential sidewall substantially perpendicular to the axial microdisk ends) and smooth circumferential sidewall. In both reactive ion etching steps, a gas mixture comprising a methane, hydrogen, and argon in a ratio of 5:17:8 was used under a gas pressure of 45 millitorr and a plasma beam power of 90 Watts. A highly selective HCl etchant (such as 10 volume % HCl aqueous solution) was then used to clear the remaining pedestal layers horizontally to form the two supporting InP pedestals or pillars 14,16 shown in FIG. 1. The etched InP pedestals or pillars exhibited a rhombus shape upon examination under scanning electron microscope as a result of anisotropic etching of the InP material.

Figure 2:
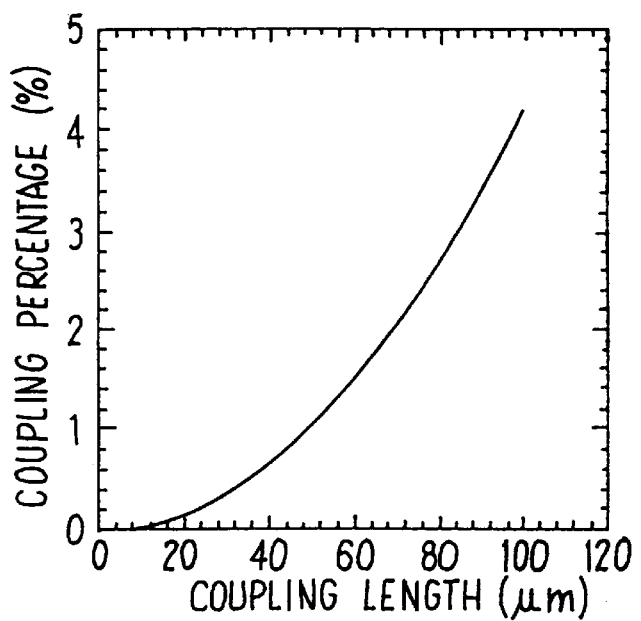
FIG. 2 is a graph of coupling percentage versus coupling length for a double-disk laser pursuant to an embodiment of the invention with a spacing between microdisks of 0.65 microns.

The upper microdisk 12 of the double-disk laser comprises a basically passive, absorptionless material at a different epitaxial level (during layer growth) for light guiding purposes. The photons generated in the lower MQW microdisk 10 leak slowly out into the upper waveguiding microdisk 12 via resonant waveguide coupling (resonant photon tunneling) through the InP pedestal or pillar 14. The coupling efficiency between the MQW microdisk 10 and the waveguiding microdisk 12 can be controlled by appropriately selecting the distance of separation between the microdisks 10, 12; e.g. about 0.65 micron in the fabrication of the 3 micron and 10 micron diameter microdisks described hereabove. As the separation distance between the microdisks 10, 12 increases, the coupling efficiency decreases. FIG. 2 shows an estimate of the coupling percentage per roundtrip length versus the coupling length (which is approximately the circumference of the microdisk structure) for a 0.65 micron separation between the microdisks 10,12. The coupling length is the roundtrip length of the photons propagating around the circumference of the microdisk, given approximately by $\pi D$, where D is the microdisk diameter. As can be seen, about 0.1 to 1% coupling efficiency was estimated for a microdisk diameter ranging from 5 to 20 microns. This double-microdisk structure enables the MQW microdisk resonator to maintain a near perfect microdisk shape with associated high Q value and low lasing threshold, while a light output coupling feature or structure can be provided on the upper waveguiding microdisk 12 to couple light out of the laser. By providing the light output coupling 18 on the upper waveguiding microdisk 12, the high Q value and low lasing threshold of the lower MQW microdisk is not adversely affected.

In FIG. 1, the light output coupling comprises V-shaped opening 18 interrupting the circumference of the upper waveguiding microdisk 12 so as to direct the light out from the double-microdisk laser. The opening 18 forms flat surfaces or windows 18a, 18b through which light can be coupled out from the laser.

The lasing characteristics of the double-microdisk laser (microdisk diameter of 10 microns) of the present invention were analyzed by optical excitation using a Nd:YAG pump laser at 1064 nanometer. The pump laser was modulated by an acousto-optic modulator with a varying duty cycle and focused to a spot size covering the entire axial end equal to or larger than the area of microdisk 10. The double-microdisk laser was- cooled down to liquid nitrogen temperature. The emission from the double-microdisk laser was collected by an objective lens dispersed by an optical grating spectrometer (resolution of 1 nanometer) and detected using a lock-in technique and a liquid-nitrogen cooled germanium detector.

Figure 3:
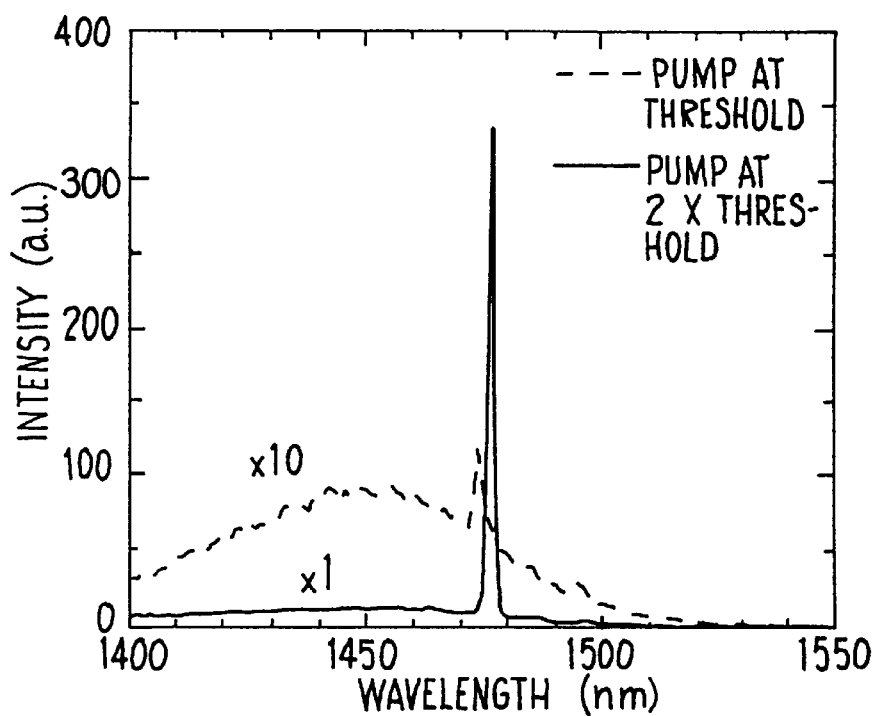
FIG. 3 is a graph of the lasing spectra versus wavelength for a double-microdisk laser pursuant to an embodiment of the invention.

FIG. 3 shows the lasing spectra obtained from the double-microdisk laser (10 microns diameter) at and above the lasing threshold. The solid data line relates to pump power above threshold, whereas the dashed data line relates to pump power at the threshold. The threshold is where the peak pump laser power is approximately 500 microWatts with a 1 microsecond pulse width and 1% duty cycle to reduce the heating. For comparison purposes, a double-microdisk laser without the opening 18 (i.e. having an uninterrupted circumference on the upper microdisk 12) was fabricated and tested for emission under the same conditions. The comparison double-microdisk laser without the light output coupling opening 18 exhibited a lower lasing threshold (approximately 300 microwatts) as a result of the lower light loss from the upper waveguiding microdisk. This is also the typical threshold value for a single microdisk laser with the same material composition and diameter as the bottom micordisk 10.

The lasing threshold of double-microdisk laser with a 3 micron disk diameter of the invention having the opening 18 in the upper microdisk 12 was determined to be approximately 25 microwatts, which is almost the same as that of a single microdisk laser with same diameter with an uninterrrupted circumference. This result is indicative that the double-microdisk laser of the invention with opening 18 provides a high Q microcavity without deteriorating the lasing threshold.

Figure 4:
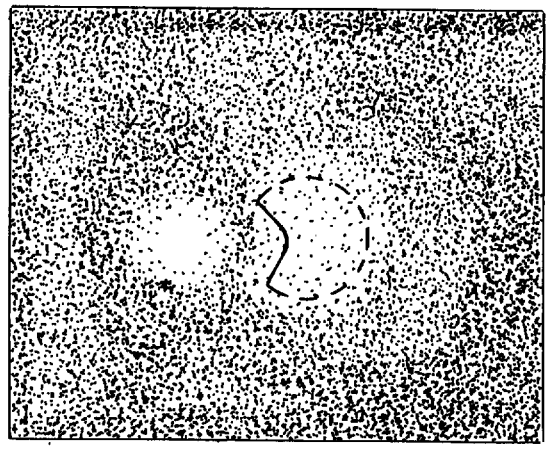
FIG. 4 is a photograph of edge-emitting lasing light output from the opening in the upper waveguiding microdisk of the laser of FIG. 1 at a wavelength of 1.5 microns.

The directional lasing output from the opening 18 of the upper waveguiding microdisk 12 of the double-microdisk laser of the invention was imaged using an infrared camera having an imaging tube with a substrate spaced about 10 microns from the flat surfaces 18a, 18b. The image of the lasing output of the opening 18 is shown in FIG. 4 where it is can be seen that lasing light is scattered from the microdisk 12 itself as well as from a strong edge-emitting spot from light escaping the opening 18 and striking the imaging substrate at about 10 microns from the opening 18. The image was taken at a pumping power twice that of the threshold value. In order to obtain the image, the pump laser had to be strongly attenuated with filters before the infrared camera. As a result of the focusing difference between the substrate 29 and the microdisk 12 itself, the image was refocused to see the light output opening on the microdisk and the top view of the double-microdisk was retraced using the dashed line shown in FIG. 4. FIG. 4 clearly shows that the opening 18 on the upper waveguiding microdisk 12 provides a leakage source of the lasing photons and directs the lasing light out from the double-microdisk laser. The bright dot on the image is due to a burned spot on the infrared imaging tube.

In lieu of the opening 18 shown in FIG. 1 as a light output coupling from the double-microdisk laser, a grating, surface or opening having a 45 degree or other suitable angle can be formed on the upper axial end of the waveguiding microdisk 12 to provide a vertical component of lasing light emission from the upper microdisk 12 of the laser of the invention.

Figure 5:
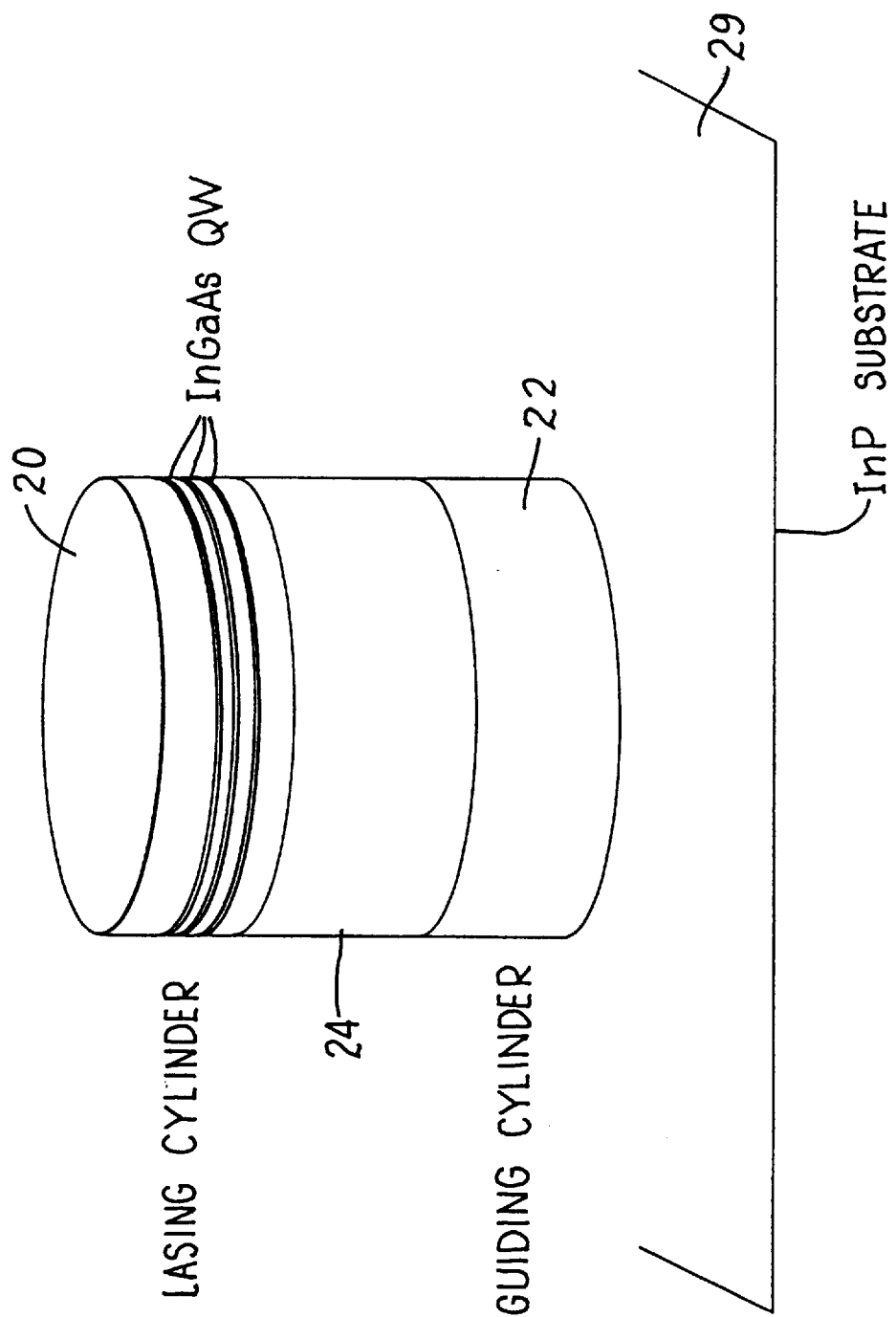
FIG. 5 is a schematic view of a microcavity (microcylinder) laser in accordance with another embodiment of the invention.
Figure 6:
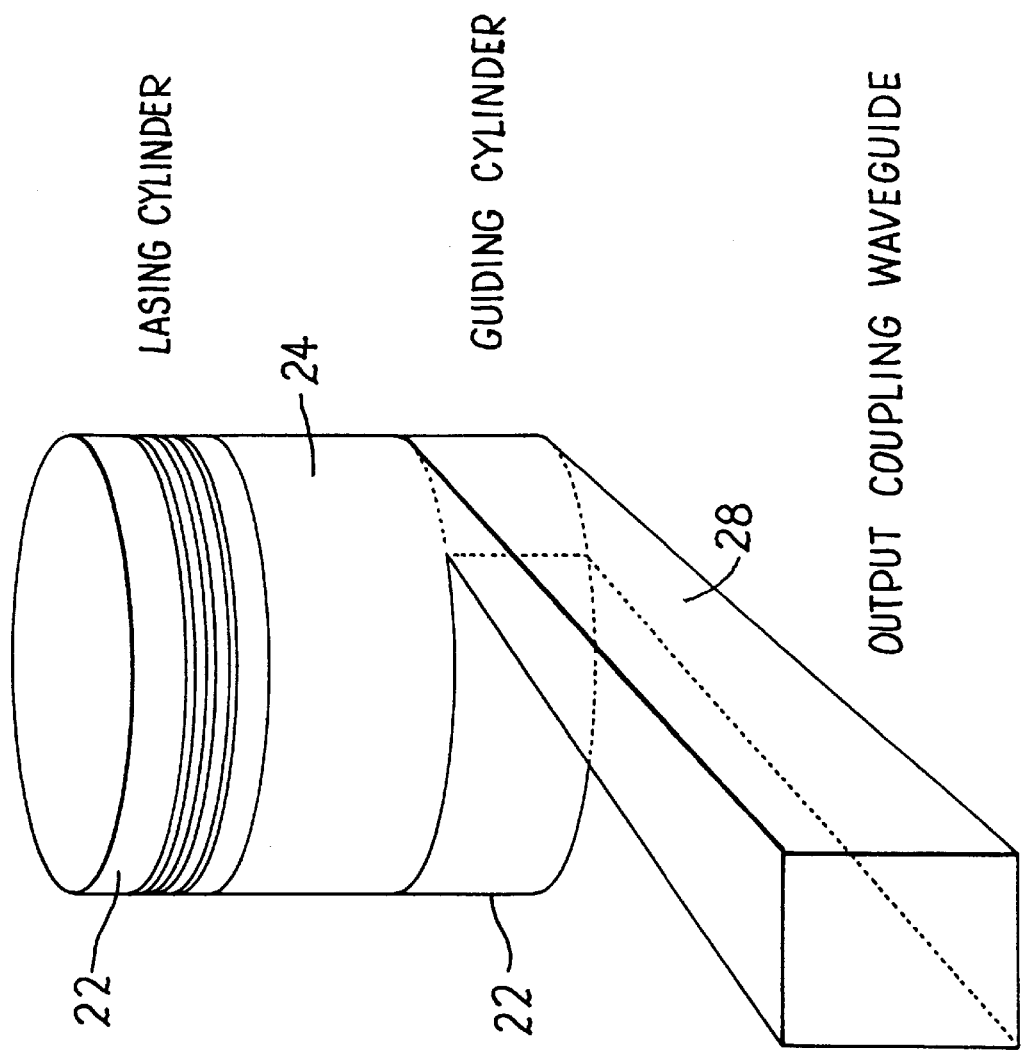
FIG. 6 is a schematic view similar to FIG. 5 of a microcavity (microcylinder) laser including a light output coupling waveguide integral with the lower waveguiding microcylinder.
Figure 7:
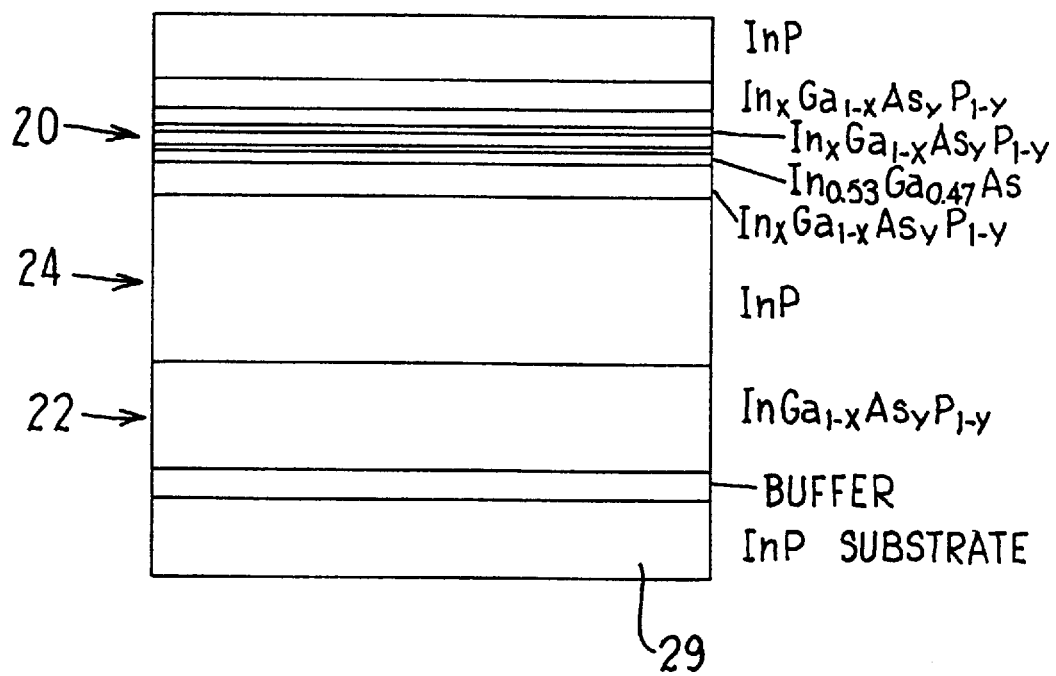
FIG. 7 is a schematic view of a double microcylinder laser of the invention showing its layered structure.

Referring to FIGS. 5–7, a microcavity semiconductor laser in accordance with another embodiment of the invention is illustrated schematically as including a first upper microcylinder (micromember) 20 referred to as lasing cylinder in FIGS. 5–6 and a second lower transparent waveguiding microdisk (micromember) 22 referred to as guiding cylinder in FIGS. 5–6 disposed in a different (lower) plane or epitaxial level (during epitaxial layer growth) from the microcylinder 20 and having low light absorption. The upper lasing microcylinder 20 is spaced a distance from the lower waveguiding microcylinder 22 to provide optical coupling therebetween by resonant photon tunneling. The microcylinders 20, 22 are spaced apart by a microcylinder 24 comprising InP to this end. The lower guiding microcylinder 22 is supported on the lower InP substrate 29 shown. The lower waveguiding microcylinder 22 includes a linear light output waveguide 28 integral therewith as a light output coupling from the laser.

The double microcylinder laser shown in FIGS. 5–7 can be formed by molecular beam epitaxial growth of layers of the InGaAs/InGaAsP system (or other suitable material systems) described above for the double microdisk embodiment and then shaping the layers to the double microcylinder configuration shown by the multistep photolithographic techniques and selective reactive ion etching techniques in similar manner as described above for the double microdisk laser. For example, the MQW layer can be grown with x and y values selected to provide three $In_{0.53}Ga_{0.47}As$ quantum layers or wells each of approximate 100 Angstroms thickness sandwiched by $In_{0.84}Ga_{0.16}As_{0.33}P_{0.67}$ barrier layers of approximate 100 Angstroms thickness with end caps having the barrier composition/thickness as described above. A lower buffer layer is provided on the substrate and comprises InP of approximately 1000 Angstrom thickness, while a top cap comprising InP of 1 micron thickness can be provided on the MQW layer.

The lower microcylinder 22 of the double-microcylinder laser comprises a basically passive material with low absorption for light guiding purposes. The photons generated in the upper MQW lasing microcylinder 20 leak slowly out into the lower waveguiding microcylinder 22 via the resonant waveguide coupling microcylinder 28. As mentioned hereabove, the coupling efficiency between the lasing microcylinder 20 and the waveguiding microcylinder 22 can be controlled by selecting the distance of separation therebetween. As the separation distance between the microcylinders 20, 22 increases, the coupling efficiency decreases.

The linear light output waveguide 28 integral with the lower microcylinder 22 includes material layers in a sequence like that of the lower micromember 22 since it is formed integrally therewith and provides a light output coupling from the laser that is at a level on the substrate 29 compatible with integrated optical circuits present on the substrate 29 so as to provide light output signals to the optical circuit.

Double microcylinder lasers of the invention are advantageous in that they have much shorter cavity lengths than the usual conventional semiconductor lasers. This enables the double microcylinder lasers of the invention to have a large frequency tunability without mode hopping via direct injection current control. The cavity length for usual conventional semiconductor lasers is 0.3 mm with an actual optical path of about 1 mm. With such a long optical path, the usual conventional laser has approximately 50 cavity resonance modes under the gain curve of the active medium. Because of the large number of frequency modes, the frequency spacing between two adjacent modes is small. As a result of the small frequency spacing, the laser frequency tunability is limited. In contrast, the double microcylinder lasers of the invention have short cavity lengths and contain much fewer cavity resonance modes (e.g. 1–5 modes) under the gain curve. The fewer number of resonance modes allows a larger frequency tunability via direct current control without frequency hopping.

Due to the low-loss high Q cavities, the microcavity lasers of the invention have high intra-cavity intensities. The high intra-cavity intensities will give rise to high stimulated emission rates, leading to fast carrier response time for the carrier density under direct current modulations. The fast carrier response time combined with the small size of the microcavities should lead to increased modulation bandwidths.

Figure 8:
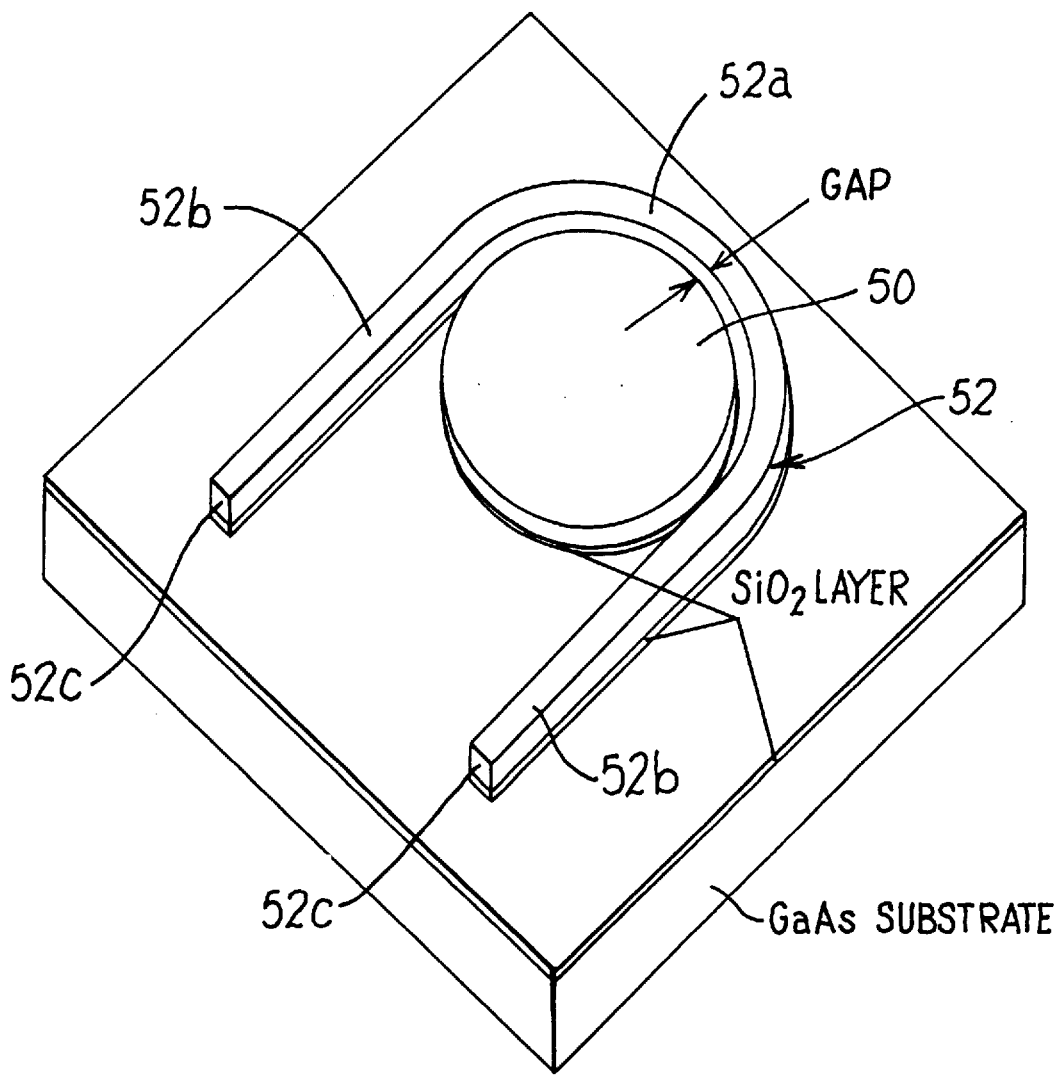
FIG. 8 is a schematic view of a microcavity laser including an arcuate waveguide spaced about and encircling a portion of the circumferential perphiery of the lower micromember pursuant to another embodiment of the invention.

Referring to FIG. 8, another embodiment of the invention is illustrated comprising a lower micromember (microdisk or microcylinder) 50 and an upper micromember (not shown) identical to the lower micromember 50 and having features like those described hereabove. The lower micromember 50 can be a waveguiding micromember while the upper micromember (not shown) can be a lasing micromember. Alternately, the lower micromember 50 can be a lasing micromember while the upper micromember (not shown) can be a waveguiding micromember or can be omitted. The lower and upper micromembers are spaced a distance apart in a manner described above to provide optical coupling therebetween by resonant photon tunneling. The lower micromember 50 can be disposed on $SiO_2$ layers on a GaAs substrate as shown and described below. An arcuate light output waveguide 52 is disposed about the lower micromember 50. The waveguide 52 can be integral with or spaced from the micromember 50 to provide a gap or distance that provides optical output coupling by resonant photon tunneling. The waveguide 52 can have typical dimensions of 0.2 to 2 micron width and 0.2 to 1 micron height. A gap up to 1.0 micron wide (e.g. 0.5 micron wide) typically has been used to this end. The light output waveguide 52 includes an arcuate, circular portion 52a that is spaced from and encircles the circumferential perphery (e.g. about 180 degrees of the circumference) of the lower micromember 50 and extends in one ore more linear, parallel legs 52b (two shown) that terminate in flat ends 52c that provide light output at a level on the GaAs substrate compatible with integrated optical circuits present on the substrate so as to provide light output signals to the optical circuit.

When the lower micromember 50 is a lasing micromember, the waveguide 52 can comprise the same material layer sequence as the lasing micromember and would be optically pumped. Alternately, the waveguide 52 can comprise the above-described transparent InGaAsP waveguide material free of quantum wells without optical pumping. When the lower micromember 50 is a waveguiding micromember, the waveguide 52 will comprise the same transparent material without quantum wells as the waveguiding micromember without optical pumping.

Figure 9:
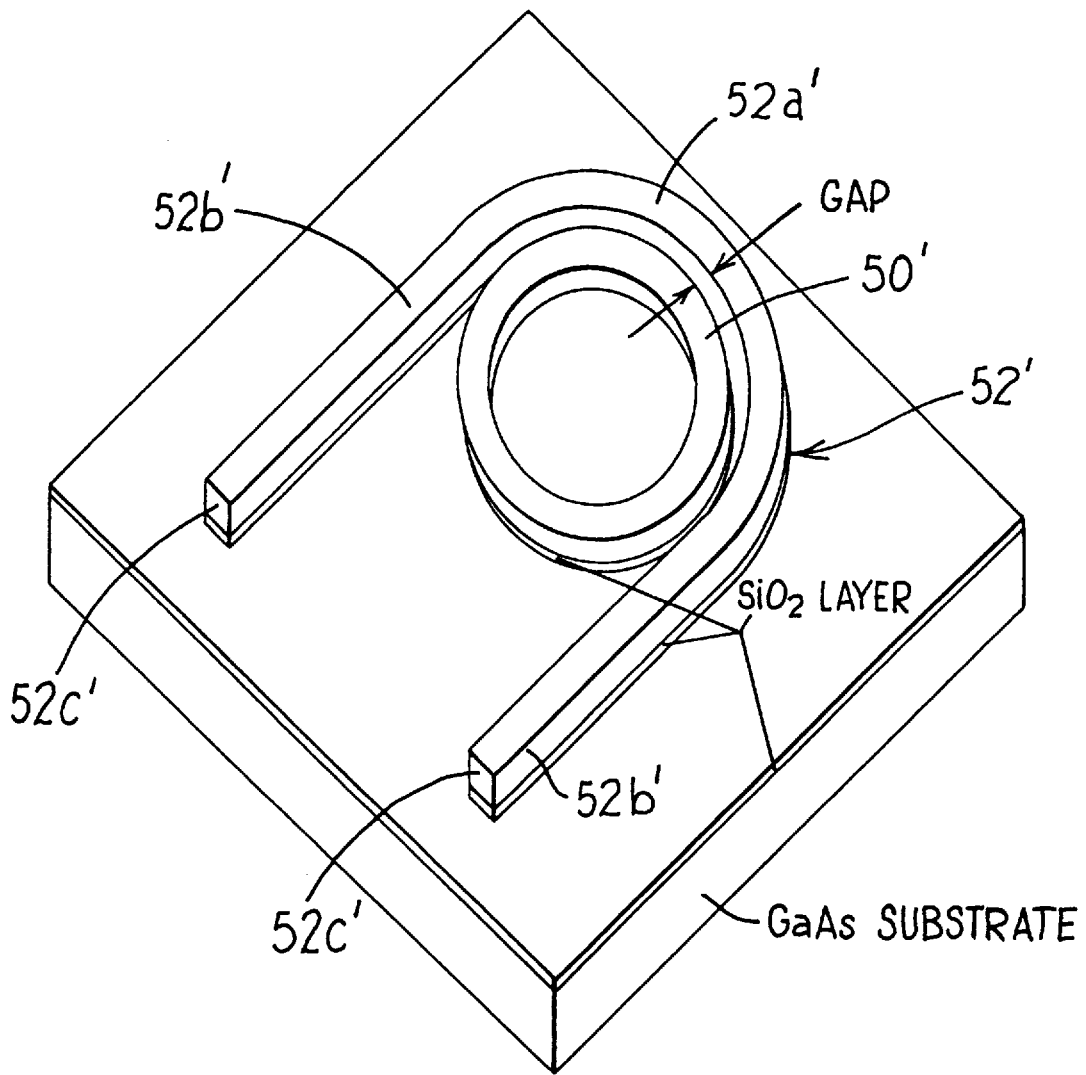
FIG. 9 is a schematic view of a microcavity laser including an arcuate waveguide spaced about and encircling a portion of the circumferential perphiery of a lower microannulus pursuant to another embodiment of the invention.

FIG. 9 illustrates schematically another embodiment of the invention similar to that of FIG. 8 with the exception that a lower microannulus 50' is employed in lieu of the lower microdisk or microcylinder of FIG. 8. The lower microannulus 50' can be a waveguiding micromember while the identical upper microannulus (not shown) can be a lasing micromember. Alternately, the lower microannulus 50' can be a lasing micromember while the upper microannulus (not shown) can be a waveguiding micromember or can be omitted. The microannulus can have an outer diameter similar to that described hereabove for the microdisks and microcylinders with a typical ring or annulus width of 0.2 to 2 microns and height of 0.2 to 1 micron. In FIG. 9, like features of FIG. 8 are designated by like reference numerals primed.

The lasers shown in FIGS. 8 and 9 having the dimensions described can be formed by molecular beam epitaxial growth of layers of the InGaAs/InGaAsP system (or other suitable material systems) as described hereabove and then shaping the layers to the double microcylinder configuration shown by the multistep photolithographic techniques and selective reactive ion etching techniques in similar manner as described hereabove for the double microdisk laser. When dimensions of the microcylinder or microannulus 50' are further reduced to, for example, a 0.4 micron ring or annulus width and 0.2 micron height, a different fabrication process can be used involving nanofabrication techniques including electron-beam (e-beam) lithography and reactive ion etching (RIE). For example, an InP substrate can be coated with an epitaxial InGaAsP/InGaAs laser layer structure of 0.19 micron thickness. Within the layer structure, three 100 Angstrom thick quantum well layers ($In_{0.53}Ga_{0.47}As$) can be separated by 100 Angstrom thick barrier layers ($In_{0.84}Ga_{0.16}As_{0.33}P_{0.67}$). They can be sandwiched by two 700 Angstrom thick ($In_{0.84}Ga_{0.16}As_{0.33}P_{0.67}$) layers on both sides.

A wafer bonding and etching technique can be used to transfer the thin microannulus 50' on top of a low-index $SiO_2$ cladding on a GaAs substrate. First, 800 Angstrom thick $SiO_2$ is deposited on the wafer via plasma enhanced chemical vapor deposition (PECVD). Electronbeam lithography is used to write the microannulus pattern on PMMA (poly methyl methylmethacrylate) coated on top of the $SiO_2$ layer. The pattern then is transferred down to the $SiO_2$ layer by etching away the unmasked region using the RIE process with $CHF_3$ as the etchant gas under 31 millitorrs with 60 Watts plasma power and then the PMMA is removed. The pattern on $SiO_2$ then forms the mask for subsequent etching of the InGaAsP layer. The RIE process is used to etch the microannulus down vertically through the 0.19 micron InGaAsP/InGaAs epitaxial layer structure into the InP substrate. In this step, a gas mixture of methane, hydrogen, and argon can be used in a ratio of 10:34:10 under a gas pressure of 45 millitorrs and a plasma beam power of 90 Watts plasma power.

In order to place the thin microannulus structure on a low-refractive-index material, the substrate is removed as follows. The RIE etched sample is deposited with 0.75 micron thick $SiO_2$ using PECVD. A piece of GaAs substrate covered with 0.75 micron thick SiO$_2$ deposited via PECVD is then prepared. The two substrates are SiO$_2$ face-to-face bonded together using acrylic. Finally, a highly selective HCl etchant (HCl plus H$_3$PO$_4$ in 1:1 ratio) was used to remove the InP substrate, leaving the microannulus laser structure on 1.5 micron thick SiO$_2$ on the GaAs substrate.

In the practice of the present invention, the estimated number of cavity modes with frequencies in the photoluminescence spectrum are less than two (single mode) if the diameter of the micromember is less than 5 microns and the spectral gain width of the quantum well is of the typical value of 60 nanometers. Microcavity outer diameters in the range of 2 microns to 5 microns are preferred to this end. However, the invention is not so limited and can be practiced using a lasing microcavity comprising one or more active quantum well (MQW) layers having a general circular cross-sectional perpiphery with a diameter up to 30 microns for example, such as from 10 to 30 microns, to provide an active optical medium that supports waveguiding optical modes, which include, but are not limited to, the whispering gallery mode. The invention also is not limited to the particular micromembers described and shown in the drawings and can be practiced using microdisk, microcylinder, microannulus (microring) and other shape micromembers so dimensioned as to provide an active optical medium that supports waveguiding optical modes.

Although the invention has been described with respect to certain specific embodiments thereof, those skilled in the art will recognize that these embodiments are offered for purposes of illustration rather than limitation and that the invention is not limited thereto but rather only as set forth in the appended claims.

We claim:

1. Laser comprising a first micromember having a lasing microcavity with a substantially circular cross-sectional periphery and a second waveguiding micromember spaced from said first micromember in a different plane and optically coupled to said first micromember, said second waveguiding micromember including a light output coupling for providing light output from said laser.

2. The laser of claim 1 wherein said first micromember comprises a microdisk.

3. The laser of claim 2 wherein said waveguiding micromember comprises a microdisk.

4. The laser of claim 3 wherein said microdisks are spaced a distance apart with a material of lower refractive index therebetween to provide resonance photon tunneling optical coupling between microdisks.

5. The laser of claim 1 wherein said first micromember comprises a microcylinder.

6. The laser of claim 5 wherein said waveguiding micromember comprises a microcylinder.

7. The laser of claim 6 wherein said microcylinders are spaced a distance apart with a material of lower refractive index therebetween to provide optial coupling between microcylinders.

8. The laser of claim 1 wherein said first micromember comprises a microannulus.

9. The laser of claim 8 wherein said waveguiding micromember comprises a microannulus.

10. The laser of claim 9 wherein said microannulus are spaced a distance apart with a material of lower refractive index therebetween to provide optial coupling therebetween.

11. The laser of claim 1 wherein said light output coupling comprises a surface on said second waveguiding member interrupting an outer circumference thereof.

12. The laser of claim 1 wherein said light output coupling comprises grating on an end surface of said waveguiding micromember.

13. The laser of claim 1 wherein said light output coupling comprises a linear output waveguide integral to said second waveguiding micromember.

14. The laser of claim 1 wherein said light output coupling comprises an arcuate output waveguide encircling a portion of said second waveguiding micromember.

15. The laser of claim 14 wherein said arcuate output waveguide comprises a circular portion encircling said portion of said second micromember and at least one linear portion terminating in an end.

16. The laser of claim 1 wherein said first micromember and second waveguiding micromember are spaced apart by a distance selected to provide a given coupling efficiency therebetween.

17. The laser of claim 1 wherein said first micromember comprises InGaAs semiconductor.

18. The laser of claim 17 wherein said second waveguiding micromember comprises InGaAsP semiconductor.

19. The laser of claim 17 wherein said optical coupling comprises InP.

20. Laser comprising a substrate, a first microdisk spaced above said substrate and having lasing microcavity with a circular cross-sectional periphery and a second waveguiding microdisk spaced above said first microdisk and optically coupled thereto, said second waveguiding microdisk having a light output coupling for providing light output from said laser.

21. Laser comprising a substrate, a first microcylinder having a lasing microcavity with a circular cross-sectional periphery and a second waveguiding microcylinder spaced between said substrate and said first microcylinder and optically coupled thereto, said second waveguiding microcylinder having a light output coupling for providing light output from said laser.

22. The laser of claim 21 wherein said light output coupling comprises a waveguide at a level on the substrate compatible with an integrated optical circuit present on the substrate so as to provide light output signals to the optical circuit.

23. Laser comprising a first micromember having a lasing microcavity and a second waveguiding micromember spaced from said first micromember in a different plane and optically coupled to said first micromember, said second waveguiding micromember including a light output coupling for providing light output from said laser.

24. The laser of claim 23 wherein said first micromember comprises a microdisk.

25. The laser of claim 24 wherein said waveguiding micromember comprises a microdisk.

26. The laser of claim 25 wherein said microdisks are spaced a distance apart with material of lower refractive index therebetween to provide resonance photon tunneling optical coupling between said microdisks.

27. The laser of claim 23 wherein said first micromember comprises a microcylinder.

28. The laser of claim 27 wherein said waveguiding micromember comprises a microcylinder.

29. The laser of claim 28 wherein said microcylinders are spaced a distance apart with material of lower refractive index therebetween to provide resonance photon tunneling optical coupling between said microcylinders.

30. The laser of claim 23 wherein said first micromember comprises a microannulus.

31. The laser of claim 30 wherein said waveguiding micromember comprises a microannulus.

* * * * *